(12) United States Patent
Shao et al.

(10) Patent No.: US 6,300,201 B1
(45) Date of Patent: Oct. 9, 2001

(54) METHOD TO FORM A HIGH K DIELECTRIC GATE INSULATOR LAYER, A METAL GATE STRUCTURE, AND SELF-ALIGNED CHANNEL REGIONS, POST SOURCE/DRAIN FORMATION

(75) Inventors: Kai Shao; Jiong Zhang; Qing Hua Zhang; Yi Min Wang; Sanford Shao Fu Chu, all of Singapore (SG)

(73) Assignee: Chartered Semiconductor Manufacturing Ltd., Singapore (SG)

( * ) Notice: Subject to any disclaimer, the term of this patent is extended or adjusted under 35 U.S.C. 154(b) by 0 days.

(21) Appl. No.: 09/523,992

(22) Filed: Mar. 13, 2000

(51) Int. Cl.[7] .................................................. H01L 21/336
(52) U.S. Cl. ............................ 438/281; 438/291; 438/300
(58) Field of Search ..................................... 438/281, 183, 438/216, 240, 231, 291, 296, 300, 305

(56) References Cited

U.S. PATENT DOCUMENTS

| | | | |
|---|---|---|---|
| 4,931,407 | * 6/1990 | Maeda et al. | 437/45 |
| 5,168,072 | * 12/1992 | Moslehi | 437/41 |
| 5,576,574 | * 11/1996 | Hong | 257/408 |
| 5,614,430 | * 3/1997 | Liang et al. | 437/45 |
| 5,688,700 | 11/1997 | Kao et al. | 437/29 |
| 5,688,706 | 11/1997 | Tsang | 437/45 |
| 5,773,348 | 6/1998 | Wu | 438/305 |
| 5,856,225 | 1/1999 | Lee et al. | 438/291 |
| 5,856,226 | 1/1999 | Wu | 438/291 |
| 6,087,208 | * 7/2000 | Krivokapic et al. | 438/183 |
| 6,100,558 | * 8/2000 | Krivokapic et al. | 257/310 |
| 6,127,232 | * 10/2000 | Chatterjee et al. | 438/291 |

* cited by examiner

Primary Examiner—John F. Niebling
Assistant Examiner—Walter L. Lindsay, Jr.
(74) Attorney, Agent, or Firm—George O. Saile; Rosemary L. S. Pike

(57) ABSTRACT

A process of fabricating a sub-micron MOSFET device, featuring a high dielectric constant gate insulator layer, and a metal gate structure, has been developed. Processes performed at temperatures detrimental to the high dielectric, gate insulator layer, such as formation of spacers on the sides of subsequent gate structures, as well as formation of source/drain regions, are introduced prior to the formation of the high dielectric, gate insulator layer. This is accomplished via use of a dummy gate structure, comprised of silicon nitride, used as a mask to define the source/drain regions, and used as the structure in which sidewall spacers are formed on. After selective removal of the dummy gate structure, creating an opening in an interlevel dielectric layer exposing the MOSFET channel region, deposition of the high dielectric, gate insulator layer, on the surface of the MOSFET channel region, is performed.

27 Claims, 4 Drawing Sheets

METHOD TO FORM A HIGH K DIELECTRIC GATE INSULATOR LAYER, A METAL GATE STRUCTURE, AND SELF-ALIGNED CHANNEL REGIONS, POST SOURCE/DRAIN FORMATION

BACKGROUND OF THE INVENTION (1) Field of the Invention

The present invention relates to methods used to fabricate semiconductor devices, and more specifically to a method used to improve the density and performance of a metal oxide semiconductor field effect transistor, (MOSFET), device, via use of enhanced processes and non-conventional gate materials.

(2) Description of Prior Art

The advent of micro-miniaturization, or use of sub-micron features, for the fabrication of MOSFET devices, is dependent on the ability of the semiconductor industry to develop new processes, and new materials, to allow the fabrication of sub-micron MOSFET devices to be realized. The attainment of sub-micron features, of 1000 Angstroms or less, realized via advancements in several semiconductor fabrication disciplines, such as photolithography, and reactive ion etching, (RIE), are benefitted by the use of dielectric layers exhibiting higher dielectric constants than the conventionally used silicon dioxide, as well as benefitted by the use of metal gate structures, with lower resistance than the conventionally used polysilicon gate structure. The need for thinner layers and structures, for use in sub-micron MOSFET devices, make the use of the high k gate insulator layer, and the metal gate structure imperative. However the high k insulator layers can not withstand temperatures greater than about 500° C. Specific process sequences, conventionally performed after gate insulator formation can degrade the integrity of the high k gate insulator layer.

This invention will describe a process sequence that allows the narrow, and shallow dopant profiles of anti-punchthrough, and of source/drain regions, to be obtained, and then retained via self-aligned processes, performed prior to the formation of the high k gate insulator layer. In addition the spacer sidewall procedure, is performed prior to the formation of the narrow anti-punchthrough region, thus preserving the desired narrow profile of this region. This is accomplished via use of a dummy gate structure, used to provide a structure for accommodation of the sidewall spacers. After formation of the source/drain region, and removal of the dummy gate structure, the anti-punchthrough region is formed in the region of the semiconductor substrate which previously was occupied by the dummy gate structure. A high k gate insulator layer is then formed on the surface vacated by the dummy gate structure, followed by the formation of a metal gate structure, overlying the high k gate insulator layer, in the space vacated by the dummy gate structure, butting against the previously formed spacer sidewalls. Prior art, such as Lee et al, in U.S. Pat. No. 5,656,225, as well as Kao et al, in U.S. Pat. No. 5,688,700, describe processes for enhancing MOSFET devices, in terms of narrow and shallow dopant regions, as well as the use of dummy gate structures, however none of these prior arts describe the use of a high k gate insulator layer, and an overlying metal gate structure, formed after the self-aligned creation of narrow, and shallow dopant regions.

SUMMARY OF THE INVENTION

It is an object of this invention to fabricate a MOSFET device using a high k, gate insulator layer, and a metal gate structure.

It is another object of this invention to restrict the exposure of the high k, gate insulator layer, and the metal gate structure, to subsequent process temperatures greater than 500° C., therefore forming the high k, gate insulator layer after the formation of gate structure sidewall spacers, and after formation of source/drain region.

It is still another object of this invention to self-align the source/drain region, using a dummy gate structure as a defining shape, followed by removal of the dummy gate structure, and implantation of channel implant regions, self-aligned in the space vacated by the dummy gate structure.

In accordance with the present invention a method of fabricating a MOSFET device structure, featuring a high k, gate insulator layer, and a metal gate structure, created after formation of sidewall spacers, and after formation of source/drain regions, both requiring process temperatures that would degrade the high k gate insulator layer, is described. After formation of well regions, and of isolation regions, a dummy, or disposable silicon nitride gate structure, is formed on an underlying silicon oxide pad layer. After formation of a lightly doped source/drain region, using the dummy gate structure as a mask, silicon oxide spacers are formed on the sides of the dummy gate structure, followed by formation of a heavily doped source/drain region, using the dummy gate structure, and the spacers, on the sides of the dummy gate structure, as a mask. Metal silicide layers are then formed on the surface of the exposed heavily doped source/drain region, followed by the deposition, and planarization of an interlevel dielectric layer. After selective removal of the dummy gate structure, resulting in an opening exposing the semiconductor channel region, ion implantation procedures are performed to self-align threshold adjust, and anti-punchthrough regions, in the channel region of the semiconductor substrate. After removal of the silicon oxide pad layer, a high k, gate insulator layer is deposited on the top surface of the semiconductor channel region. Deposition of a metal layer, followed by removal of unwanted regions of the metal layer, from the top surface of the interlevel dielectric layer, result in the formation of a metal gate structure, overlying the high k, gate structure, in the opening created by the removal of the dummy gate structure.

BRIEF DESCRIPTION OF THE DRAWINGS

The object and other advantages of this invention are best described in the preferred embodiments with reference to the attached drawings that include.

DESCRIPTION OF THE PREFERRED EMBODIMENTS

Figure 1:
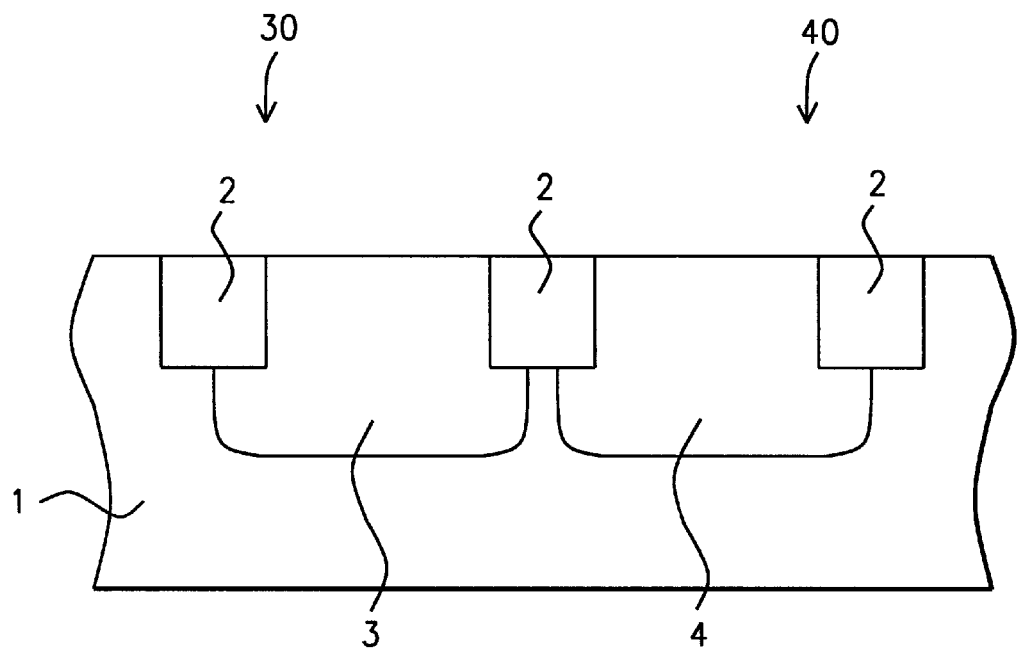
FIGS. 1–8, which schematically, in cross-sectional style, show key stages of fabrication used to create a MOSFET device, featuring a high k, gate insulator layer, and a metal gate structure.

The method of fabricating a MOSFET device structure, featuring a high k, gate insulator layer, and a metal gate structure, both formed after high temperature processing steps, such as formation of sidewall spacers, and the formation of source/drain regions, will now be described in detail. This invention will be described for complimentary MOSFET devices, or CMOS devices, comprised with both N channel, (NFET), devices, as well as with P channel devices, (PFET). However this invention can be applied to either only NFET, or only PFET devices. A P type, semiconductor substrate 1, comprised of single crystalline silicon, with a <100> crystallographic orientation is used and schematically shown in FIG. 1. Isolation regions 2, shown schematically in FIG. 1, can be comprised of thermally grown, field oxide, (FOX), regions, at a thickness between about 2500 to 5000 Angstroms, or isolation regions 2, can be comprised with insulator filled shallow trenches, with the shallow trench at a depth in the semiconductor substrate, being between about 2500 to 5000 Angstroms. Conventional photolithographic masking procedures are then used to protect the PFET region 40, from an ion implantation procedure used to create P well region 3, in NFET region 30. The ion implantation procedure is performed using boron, or $BF_2$ ions, at an energy between about 150 to 300 KeV, at dose between about 5E12 to 1E13 atoms/$cm^2$, creating P well region 3, with the P well region featuring a higher P type dopant concentration than the P type, dopant concentration of semiconductor substrate 1. After removal of the photoresist mask, used to protect PFET region 40, from the P well ion implantation procedure, another photoresist shape is formed, protecting NFET region 30, from an ion implantation procedure used to create N well region 4, in PFET region 40. This is accomplished via implantation of either arsenic, or phosphorous ions, at an energy between about 400 to 500 KeV, at a dose between about 1E13 to 2E13 atoms/$cm^2$. The photoresist shape used to protect NFET region 30, from the N well, ion implantation procedure, is removed via plasma oxygen ashing and careful wet cleans. The result of these procedures is schematically shown in FIG. 1.

Figure 2:
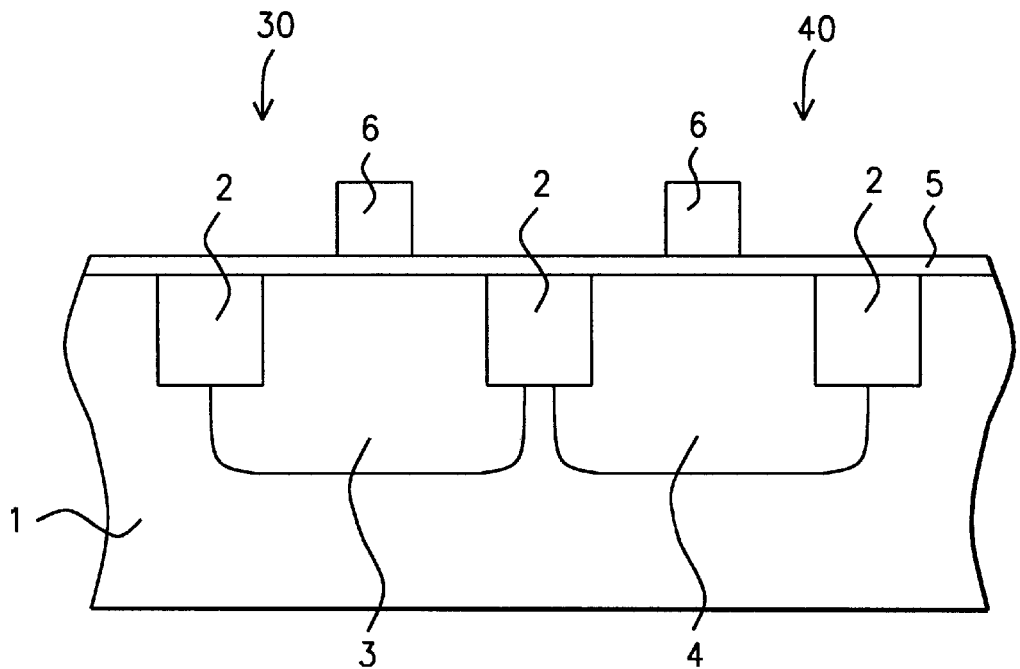

The creation of silicon nitride, dummy gate structures, is next addressed and schematically shown in FIG. 2. A silicon oxide layer 5, is either thermally grown, or deposited via low pressure chemical vapor deposition, (LPCVD), or via plasma enhanced chemical vapor deposition, (PECVD), procedures, to a thickness between about 50 to 200 Angstroms, followed by the deposition of a silicon nitride layer, via LPCVD or PECVD procedures, to a thickness between about 1500 to 2500 Angstroms. The thickness of the silicon nitride layer will ultimately determine the thickness of a subsequent metal gate structure. Conventional photolithographic and anisotropic reactive ion etching, (RIE), procedures, using $CHF_3/CF_4$ as an etchant, to selectively etch silicon nitride, terminating at the appearance of silicon oxide layer 5, are used to form silicon nitride structures 6. The width, or dimension of silicon nitride structures 6, will subsequently determine the channel length of the MOSFET devices. Therefore the sub-micron MOSFET devices feature the width of silicon nitride structure 6, which will result in a subsequent channel length of between about 1000 to 3000 Angstroms. Removal of the photoresist shape used to define silicon nitride structures 6, is accomplished via plasma oxygen ashing and careful wet cleans.

Figure 3:
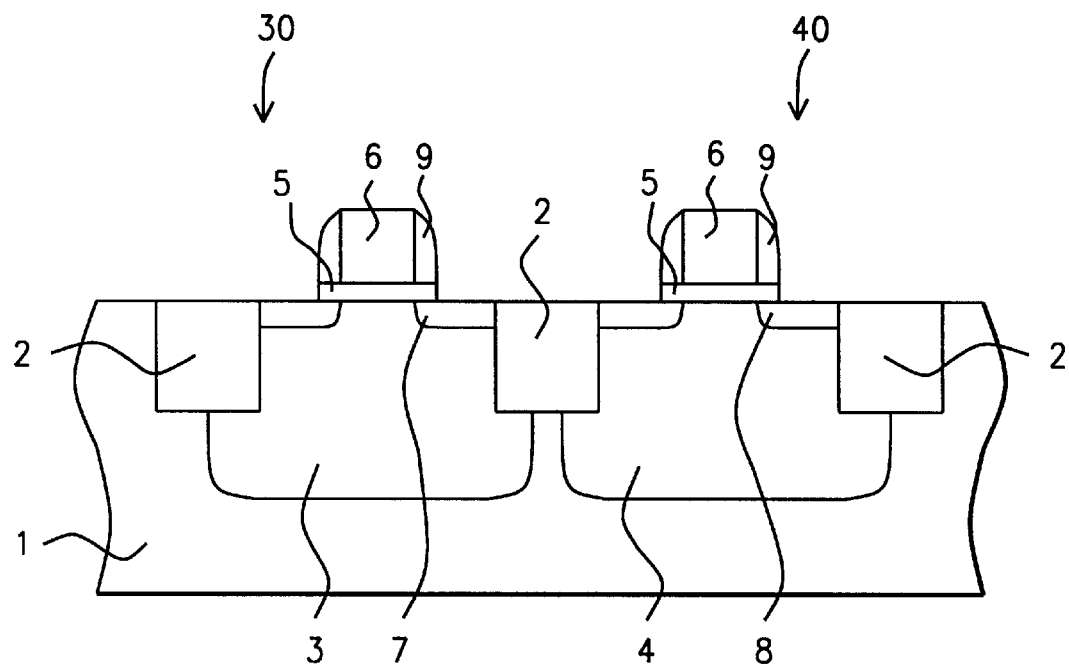

Lightly doped source/drain, (LDD), regions are next formed in both NFET region 30, as well as in PFET region 40. A photoresist shape is used to block PFET region 40, from an ion implantation procedure, using arsenic or phosphorous ions, at an energy between about 10 to 30 KeV, at a dose between about 1E14 to 1E15 atoms/$cm^2$, creating N type, LDD region 7, in NFET region 30. The LDD regions are self-aligned to silicon nitride structures 6, or with a subsequent channel region, in semiconductor substrate 1. After removal of the photoresist shape, used to block PFET region 40, from the implantation procedure use to create N type, LDD region 7, performed via plasma oxygen ashing and careful wet clean procedures, another photoresist shape is formed and used as a mask to protect NFET region 30, from the ion implant process used to create P type, LDD region 8, in PFET region 40. This is accomplished via implantation of boron, or $BF_2$ ions, at an energy between about 5 to 30 KeV, at a dose between about 5E12 to 1E14 atoms/$cm^2$. The P type, LDD region is again self-aligned to silicon nitride structures 6. The photoresist shape used to block NFET region 30, from the implantation procedures use to create the P type, LDD region, is again removed via plasma oxygen ashing and careful wet cleans. A silicon oxide layer is then deposited, via LPCVD or PECVD procedures, at a thickness between about 1000 to 2000 Angstroms, then subjected to a selective, anisotropic RIE procedure, using $CHF_3$ as an etchant, creating spacers 9, on the sides of silicon nitride structures 6. The spacer RIE procedure also removes the portion of silicon oxide layer 5, not covered by spacers 9, or by silicon nitride structures 6. The result of these procedures are schematically shown in FIG. 3.

Figure 4:
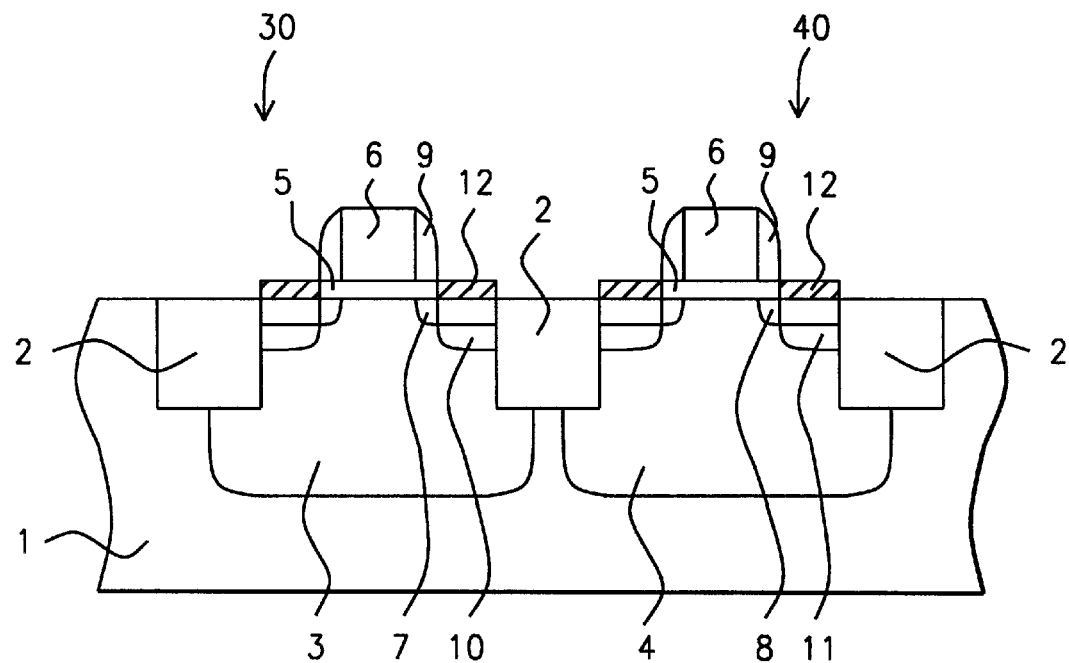

Heavily doped source/drain regions, are next formed for both NFET and PFET regions. Again photoresist shapes are used to protect PFET region 40, from procedures used to create N type, heavily doped source/drain region 10, in NFET region 30, and then to protect NFET region 30, from ion implantation procedures used to create P type, heavily doped source/drain region 11, in PFET region 40. N type, heavily doped source/drain region 10, is formed via ion implantation of arsenic, or phosphorous ions, at an energy between about 50 to 80 KeV, at a dose between about 2E15 to 4E15 atoms/$cm^2$, while P type, heavily doped source/drain region 11, is formed via ion implantation of boron, or $BF_2$ ions, at an energy between about 30 to 50 KeV, at a dose between about 2E15 to 4E15 atoms/$cm^2$. This is schematically shown in FIG. 4. After removal of the photoresist blocking shapes, via plasma oxygen ashing and careful wet cleans, an anneal is performed at a temperature between about 850 to 1000° C., for a time between about 20 to 60 sec, to activate the implanted dopants in the LDD and in the heavily doped source/drain regions. A metal layer, such as titanium, is next deposited via plasma vapor deposition, (PVD), procedures, to a thickness between about 200 to 400 Angstroms. An anneal procedure, performed using either rapid thermal annealing, (RTA), or conventional furnace procedures, is employed at a temperature between about 600 to 750° C., resulting in the formation of metal silicide, or titanium silicide layer 12, on regions in which the metal layer overlayed the top surface of the heavily doped source regions, while the portions of the metal layer which resided on insulator surfaces, such as spacers 9, or the top surface of silicon nitride structures 6, remain unreacted. Selective removal of unreacted regions of the metal layer is accomplished via use of a solution comprised of $H_2SO_4$—$H_2O_2$—$NH_4OH$. If desired a second anneal procedure, again performed using either RTA or conventional furnace procedures, can be performed at a temperature between about 800 to 900° C., to reduce the resistance of metal silicide layers 12. The result of these procedures is schematically shown in FIG. 4.

Figure 5:
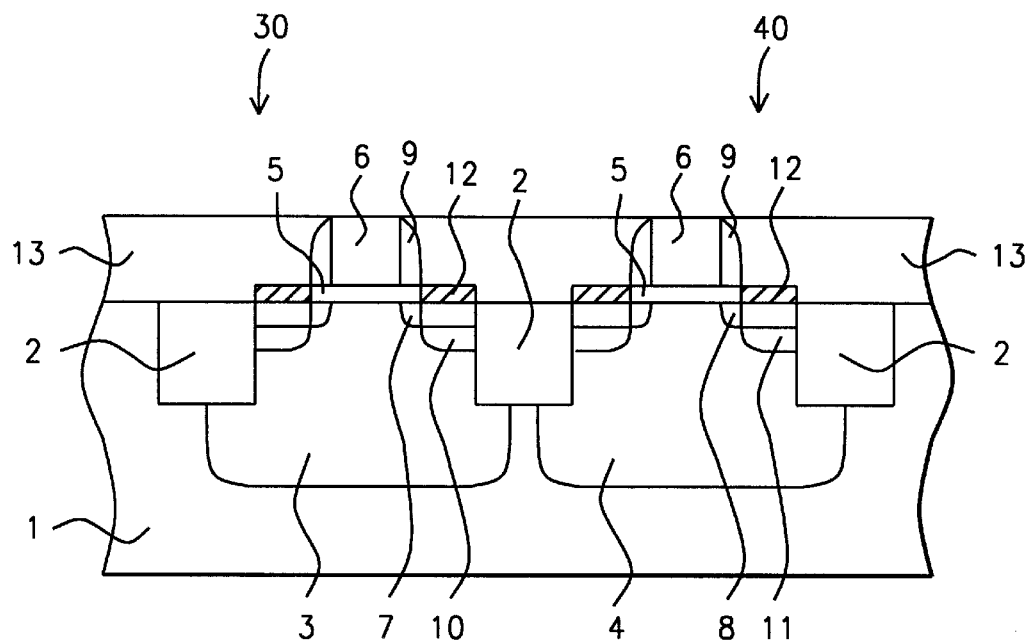

The high temperature processing steps needed to successfully fabricate the sub-micron MOSFET, or CMOS devices, which can deleteriously influence the profile of narrow dopant regions, or degrade high k, gate insulator layers, has been concluded, therefore allowing the attainment of these regions, and of these materials to be addressed. The process sequence is then continued with the deposition of an interlevel dielectric, (ILD), layer 13, comprised of silicon oxide, or of borophosphosilicate glass, (BPSG), obtained via PECVD procedures, at a temperature between about 400 to 500° C., to a thickness between about 5000 to 8000 Angstroms. A chemical mechanical polishing, (CMP), procedure, is next used to planarize ILD layer 13, with the procedure terminating at the appearance of the top surface of silicon nitride structures 6. This is schematically shown in FIG. 5.

Figure 6:
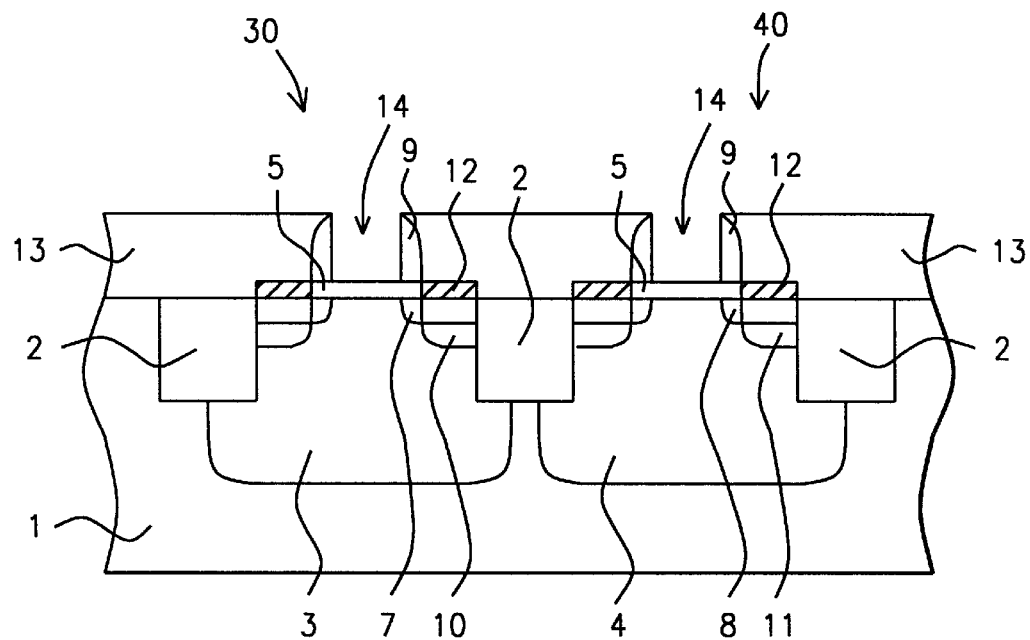

The selective removal of silicon nitride structures 6, is addressed, via use of a hot phosphoric acid solution, resulting the appearance of openings 14, schematically shown in FIG. 6. Openings 14, with a width equal to the width of silicon nitride structures 6, will allow self-aligned ion implantation procedures to define the subsequent MOSFET channel region, in semiconductor substrate 1.

Figure 7:
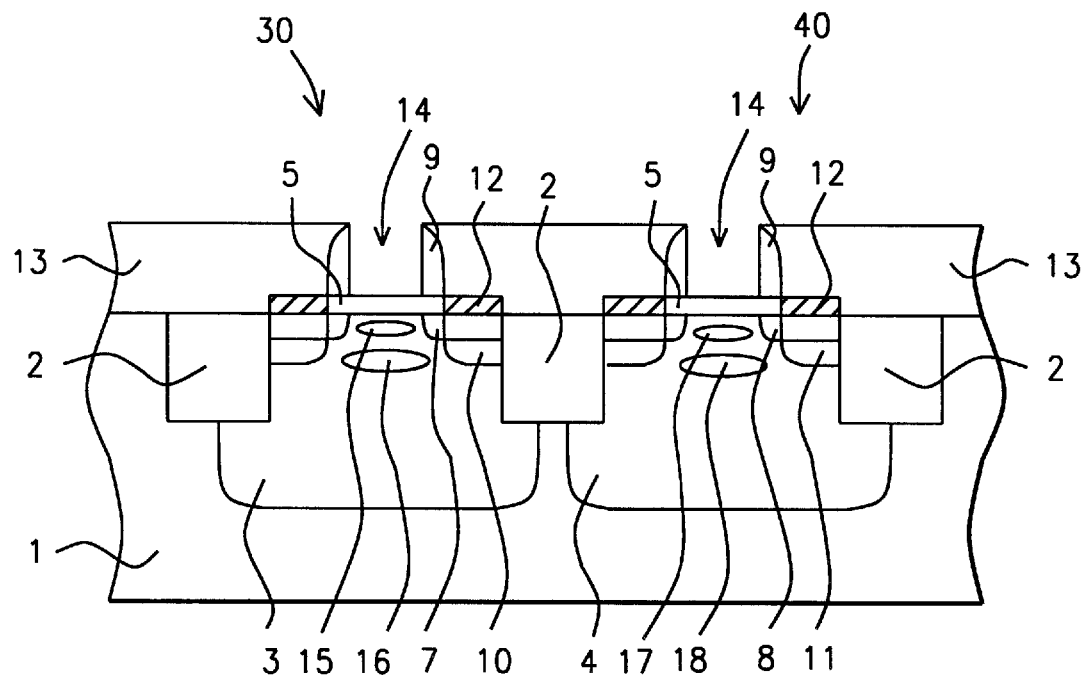

Threshold voltage adjust, (Vt), region 15, and anti-punchthrough region 16, are next formed in the channel region of NFET region 30, exposed in openings 14, via ion implantation procedures. A photoresist shape is used to block PFET region 40, from these ion implantation procedures. Vt region 15, shown schematically in FIG. 7, is used to alter the P type concentration near the surface of the NFET channel region, thus adjusting the threshold voltage of the NFET device. This is accomplished via implantation of boron, or $BF_2$ ions, at an energy between about 10 to 30 KeV, at a dose between about 3E12 to 4E12 atoms/cm$^2$, and at an implant angle between about 0 to 7°. This is followed by creation of NFET anti-punchthrough region 16, obtained via implantation of boron, or $BF_2$ ions, at an energy between about 60 to 100 KeV, at a dose between about 4.5E12 to 6E12 atoms/cm$^2$, and using an implant angle between about 0 to 7°. Anti-punchthrough region 16, created using a tilted implant procedure, allows a narrow region, more heavily P type doped than semiconductor substrate 1, to restrict the depletion region created by N type LDD regions 7, and the more lightly doped semiconductor substrate 1. This is also schematically shown in FIG. 7. Removal of the photoresist shape, used to protect PFET region 40, from the implant procedures performed to NFET region 30, is performed, followed by definition of another photoresist shape, used to now protect NFET region 30, from ion implantation procedures used to create the threshold voltage adjust, and anti-punchthrough regions, in PFET region 40. Threshold voltage adjust region 17, is accomplished via implantation of phosphorous or arsenic ions, at an energy between about 50 to 80 KeV, at a dose between about 1E12 to 2E12 atoms/cm$^2$, using an implant angle between about 0 to 7°. This is followed by creation of anti-punchthrough region 18, via implantation of arsenic, or phosphorous ions, at an energy between about 80 to 150 KeV, at a dose between about 5E12 to 1E13 atoms/cm$^2$, and at an implant angle between about 0 to 7°. The attainment of these narrow regions, in the NFET and PFET channel regions may have been compromised if subjected to high temperature processing, such as spacer, source/drain, or metal silicide formation, thus the process sequence of establishing these channel regions post high temperature processing, preserved the desired, narrow dimensions of these regions. The result of the creation of the PFET channel region is shown schematically in FIG. 7.

Figure 8:
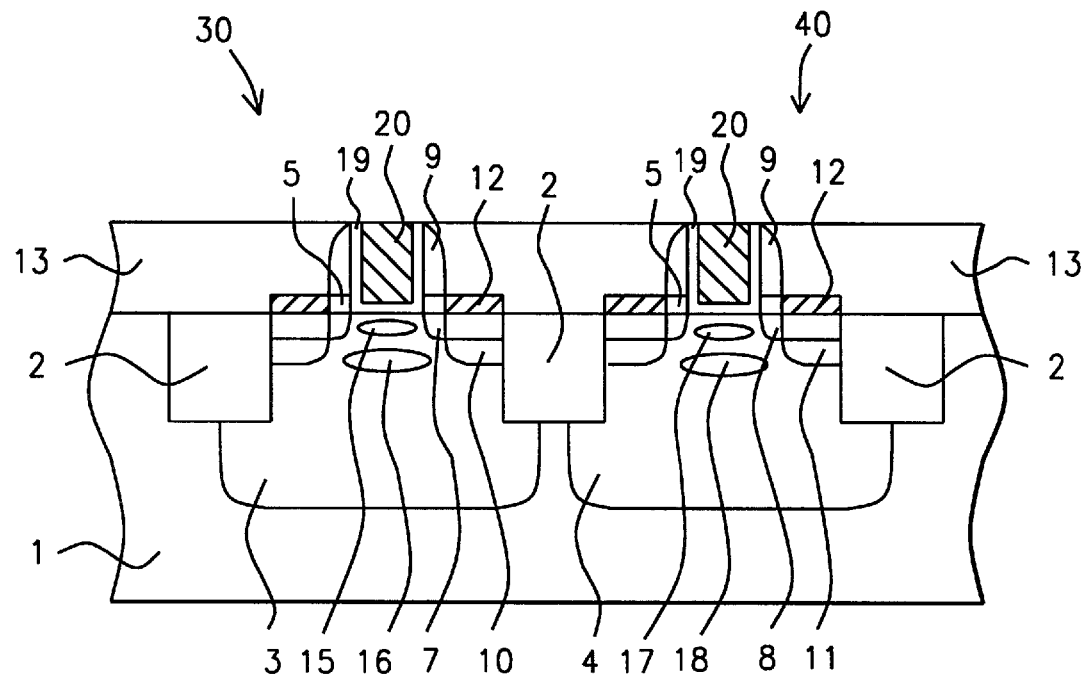

Removal of the photoresist shape, used to protect NFET region 30, from the implantation procedures used to form the narrow channel regions in PFET region 40, is accomplished using plasma oxygen ashing and careful wet clean procedures, with the wet clean procedure featuring a buffered hydrofluoric acid dip, resulting in the removal of the region of silicon oxide layer 5, exposed in openings 14. A high k, gate insulator layer 19, such as $Si_3N_4$, or $Ta_2O_5$, is next deposited via chemical vapor deposition, (CVD), procedures, to a thickness between about 50 to 100 Angstroms. The thickness of high k, gate insulator layer 19, with a dielectric constant between about 7 to 20, can be thicker than counterpart silicon dioxide, gate insulator layers, comprised with a dielectric constant of only about 3.9. Again as previously mentioned, high k, gate insulator layer 19, would degrade if subjected to temperatures greater than 500° C., therefore the formation of this layer has to be accomplished after the performance of the previously mentioned high temperature process steps. In addition to the performance increases realized via narrow dopant regions, and the use of thin gate insulator layers, the use of higher conductivity metal gate structures, in contrast to more resistive, polysilicon gate structures, allows thinner, more conductive gate structures to be achieved. This is accomplished, and schematically shown in FIG. 8, via deposition of a metal layer such as.tungsten, via CVD procedures, to a thickness between about 3000 to 4000 Angstroms, completely filling openings 14. A CMP procedure is then employed to remove regions of the metal layer, from the top surface of ILD layer 13, resulting in the formation of metal gate structures 20, on high k, gate insulator layer 19. The CMP procedure also removes the portion of high k, gate insulator layer 19, from the top surface of ILD layer 13. Metal gate structures 20, are formed to a height, between about 2000 to 3000 Angstroms, equal to the thickness of previously removed, silicon nitride structures 6.

While this invention has been particularly shown and described with reference to the preferred embodiments thereof, it will be understood by those skilled in the art that various changes in form and details may be made without departing from the spirit or scope of the invention.

What is claimed is:

1. A method of fabricating a metal oxide semiconductor field effect, (MOSFET), device, on a semiconductor substrate, comprising the steps of:

forming a well region, in said semiconductor substrate;

growing a silicon oxide layer on said semiconductor substrate;

forming a disposable gate structure, on said silicon oxide layer;

forming a lightly doped source/drain region, in an area of said semiconductor substrate not covered by said disposable gate structure;

forming insulator spacers on the sides of said disposable gate structure, removing portions of said silicon oxide layer not covered by said disposable gate structure, or by said insulator spacers;

forming a heavily doped source/drain region in an area of said semiconductor substrate not covered by said dummy gate structure or by said insulator spacers;

forming a metal silicide layer on the top surface of said heavily doped source/drain region;

depositing an interlevel dielectric layer;

planarizing said interlevel dielectric layer, exposing the top surface of said dummy gate structure;

selectively removing said dummy gate structure, resulting in an opening, created in said interlevel dielectric layer, and in said insulator spacers, exposing a region of said semiconductor substrate to be used for MOSFET channel region;

forming a threshold adjust region in a top portion of said MOSFET channel region;

forming a anti-punchthrough region in a bottom portion of said MOSFET channel region;

forming a gate insulator layer on the top surface of said MOSFET channel region, exposed in said opening; and forming a gate structure, on said gate insulator layer, in said opening.

2. The method of claim 1, wherein said MOSFET device is an N channel device, formed in a P well region, located in said semiconductor substrate.

3. The method of claim 1, wherein said MOSFET device is a P channel device, formed in an N well region, located in said semiconductor substrate.

4. The method of claim 1, wherein said disposable gate structure is comprised of silicon nitride, obtained via deposition of a silicon nitride layer, via LPCVD or PECVD procedures, at a thickness between about 1500 to 2500 Angstroms, and patterned via anisotropic RIE procedures, using $CHF_3/CF_4$ as an etchant.

5. The method of claim 1, wherein the width of said disposable gate structure is between about 1000 to 3000 Angstroms, with the height of said disposable gate structure between about 2000 to 3000 Angstroms.

6. The method of claim 1, wherein said insulator spacers, on the sides of said disposable gate structure, are comprised of silicon oxide, formed from a silicon oxide layer, obtained via LPCVD or PECVD procedures, at a thickness between about 1000 to 2000 Angstroms, and defined via an anisotropic RIE procedure, using $CHF_3$ as an etchant.

7. The method of claim 1, wherein said interlevel dielectric layer is comprised of either silicon oxide, or borophosphosilicate glass, via LPCVD or PECVD procedures, at a thickness between about 5000 to 8000 Angstroms.

8. The method of claim 1, wherein said disposable gate structure is selectively removed via use of a hot phosphoric acid solution.

9. The method of claim 1, wherein said opening, created via removal of said disposable gate structure, has a width between about 1000 to 3000 Angstroms.

10. The method of claim 1, wherein said anti-punchthrough region, for an N channel, MOSFET device is formed via ion implantation of boron, or $BF_2$ ions, at an energy between about 60 to 100 KeV, at a dose between about 4.5E12 to 6E12 atoms/cm$^2$, and at an implant angle between about 0 to 7°.

11. The method of claim 1, wherein said anti-punchthrough region, for a P channel, MOSFET device is formed via ion implantation of phosphorous, or arsenic ions, at an energy between about 80 to 150 KeV, at a dose between about 5E12 to 1E13 atoms/cm$^2$, and at an implant angle between about 0 to 7°.

12. The method of claim 1, wherein said gate insulator layer is a high dielectric constant layer, such as $Si_3N_4$ or $Ta_2O_5$, deposited at a thickness between about 50 to 100 Angstroms, via chemical vapor deposition, (CVD), procedures, with a dielectric constant between about 7 to 20.

13. The method of claim 1, wherein said gate structure, is a metal gate structure, comprised of tungsten, obtained via CVD procedures, to a thickness between about 3000 to 4000 Angstroms, then defined via chemical mechanical polishing procedures, forming said gate structure, in said opening.

14. A method of forming a narrow channel length, MOSFET device, on a semiconductor substrate, featuring a high dielectric gate insulator layer, and a metal gate structure, formed after the creation of insulator spacers, and after formation of source/drain regions, comprising the steps of:

forming a well region, in said semiconductor substrate;

forming a silicon oxide pad layer, on said semiconductor substrate;

forming a narrow width, silicon nitride dummy gate structure, on said silicon oxide pad layer;

forming a lightly doped source/drain region in an area of said semiconductor substrate, not covered by said narrow width, silicon nitride dummy gate structure;

forming silicon oxide spacers on the sides of said narrow width, silicon nitride dummy gate structure, removing exposed portions of said silicon oxide pad layer;

forming a heavily doped source/drain region in a area of said semiconductor substrate not covered by said narrow width, silicon nitride dummy gate structure, or by said silicon oxide spacers;

forming a titanium silicide layer on the top surface of said heavily doped source/drain region;

depositing an interlevel dielectric layer;

performing a chemical mechanical polishing procedure to planarize said interlevel dielectric layer, and to expose the top surface of said narrow width, silicon nitride dummy gate structure;

selectively removing said narrow width, silicon nitride dummy gate structure, from the top surface of said silicon oxide pad layer, resulting in an opening in said interlevel dielectric layer, exposing a region of said semiconductor substrate, to be used for a narrow channel length region, for the MOSFET device;

forming a threshold adjust region in a top portion of said narrow length channel region, exposed in said opening;

forming said anti-punchthrough region, in a lower portion of said narrow length channel region, exposed in said opening;

removing portions of said silicon oxide pad layer, exposed in said opening;

depositing said high dielectric gate insulator layer, on the top surface of said narrow length channel region;

depositing a metal layer completely filling said opening; and removing portions of said metal layer from the top surface of said interlevel dielectric layer, creating said metal gate structure, on said high dielectric constant gate insulator layer, in said opening.

15. The method of claim 14, wherein said narrow channel length MOSFET device is an N channel device, formed in a P well region, located in said semiconductor substrate.

16. The method of claim 14, wherein said narrow channel length MOSFET device is a P channel device, formed in an N well region, located in said semiconductor substrate.

17. The method of claim 14, wherein said narrow width, silicon nitride dummy gate structure is obtained via deposition of a silicon nitride layer, via LPCVD or PECVD procedures, at a thickness between about 1500 to 2500 Angstroms, followed by a patterning procedure, performed using an anisotropic RIE procedure, using $CHF_3/CF_4$ as an etchant.

18. The method of claim 14, wherein the width of said narrow width, silicon nitride dummy gate structure is between about 1000 to 3000 Angstroms, with a height between about 2000 to 3000 Angstroms.

19. The method of claim 14, wherein said silicon oxide spacers, on the sides of said narrow width, silicon nitride dummy gate structure are formed from a silicon oxide layer, obtained via LPCVD or PECVD procedures, at a thickness between about 1000 to 2000 Angstroms, then defined via an anisotropic RIE procedure, using $CHF_3$ as an etchant.

20. The method of claim 14, wherein said titanium silicide layers are formed from said titanium layer, and said heavily source/drain region, via an anneal procedure, performed using either a rapid thermal anneal procedure, or via a conventional furnace anneal, at a temperature between about 850 to 1000° C.

21. The method of claim 14, wherein said interlevel dielectric layer is comprised of either silicon oxide, or borophosphosilicate glass, via LPCVD or PECVD procedures, at a thickness between about 5000 to 8000 Angstroms.

22. The method of claim 14, wherein said narrow width, silicon nitride dummy gate structure is selectively removed via use of a hot phosphoric acid solution.

23. The method of claim 14, wherein said opening, in said interlevel dielectric layer, exposing a region of said semiconductor substrate to be used for said narrow channel length region, for the MOSFET device, has a width between about 1000 to 3000 Angstroms.

24. The method of claim 14, wherein said antipunchthrough region, for an N channel, MOSFET device is formed via ion implantation of boron, or $BF_2$ ions, at an energy between about 60 to 100 KeV, at a dose between about 4.5E12 to 6E12 atoms/cm$^2$, and at an implant angle between about 0 to 7°.

25. The method of claim 14, wherein said antipunchthrough region, for a P channel, MOSFET device is formed via ion implantation of phosphorous, or arsenic ions, at an energy between about 80 to 150 KeV, at a dose between about 5E12 to 1E13 atoms/cm$^2$, and at an implant angle between about 0 to 7°.

26. The method of claim 14, wherein said high dielectric constant gate insulator layer, is a $Si_3N_4$ or $Ta_2O_5$ layer, deposited at a thickness between about 50 to 100 Angstroms, via chemical vapor deposition, (CVD) procedures, with a dielectric constant between about 7 to 20.

27. The method of claim 14, wherein said metal gate structure is comprised of tungsten, obtained via CVD procedures, to a thickness between about 3000 to 4000 Angstroms, then defined via chemical mechanical polishing procedures, forming said metal gate structure, in said opening.

* * * * *